United States Patent
Chen

(10) Patent No.: US 9,552,518 B2
(45) Date of Patent: Jan. 24, 2017

(54) METHOD OF OUT-OF-BAND CORRECTION FOR MULTISPECTRAL REMOTE SENSING

(71) Applicant: Wei Chen, Potomac, MD (US)

(72) Inventor: Wei Chen, Potomac, MD (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 638 days.

(21) Appl. No.: 13/944,072

(22) Filed: Jul. 17, 2013

(65) Prior Publication Data

US 2013/0301924 A1 Nov. 14, 2013

Related U.S. Application Data

(63) Continuation-in-part of application No. 13/862,539, filed on Apr. 15, 2013, now Pat. No. 9,153,187.

(60) Provisional application No. 61/674,954, filed on Jul. 24, 2012.

(51) Int. Cl.
  *G06K 9/00* (2006.01)
  *H03K 17/14* (2006.01)
  *H03K 17/687* (2006.01)
  *H03K 17/693* (2006.01)

(52) U.S. Cl.
  CPC ........... *G06K 9/0063* (2013.01); *H03K 17/145* (2013.01); *H03K 17/687* (2013.01); *H03K 17/6872* (2013.01); *H03K 17/693* (2013.01)

(58) Field of Classification Search
  CPC .............................. G01J 3/2823; G06K 9/0063
  See application file for complete search history.

(56) References Cited

U.S. PATENT DOCUMENTS

| | | | |
|---|---|---|---|
| 8,942,424 B2* | 1/2015 | Chen .................... | G06K 9/0063 382/103 |
| 2009/0231421 A1* | 9/2009 | Arai ..................... | A61K 49/006 348/79 |

(Continued)

OTHER PUBLICATIONS

Bo-Cai Gao and Wei Chen, "Multispectral decomposition for the removal of out-of-band effects of visible/infrared imaging radiometer suite visible and near-infrared bands," posted Apr. 13, 2012, Applied Optics, vol. 51, No. 18, p. 1079-4086.*

(Continued)

*Primary Examiner* — Violeta A Prieto
(74) *Attorney, Agent, or Firm* — US Naval Research Laboratory; Suresh Koshy

(57) ABSTRACT

A method of image processing. A band-averaged spectral radiance is measured using at least one optical filter upon scanning a plurality of original radiances. The measured band-averaged spectral radiance includes a measured in-band-averaged spectral radiance and a measured band-gap-averaged spectral radiance. A multispectral radiance vector is generated from the measured band-averaged spectral radiance. The multispectral radiance vector and an out-of-band correction transform matrix corresponding to the at least one optical filter are matrix-multiplied to generate a band-averaged spectral radiances image vector representing a plurality of recovered band-averaged spectral radiances. The plurality of recovered band-averaged spectral radiances is analyzed for a presence of a target.

7 Claims, 7 Drawing Sheets

(56) References Cited

U.S. PATENT DOCUMENTS

2010/0328356 A1* 12/2010 Tin ...................... G09G 3/2003
                                                        345/690
2013/0342845 A1* 12/2013 Chen .................... G01J 3/0205
                                                        356/419
2014/0029793 A1*  1/2014 Chen .................... G06K 9/0063
                                                        382/103

OTHER PUBLICATIONS

Wang et al. Effects of spectral bandpass on SeaWIFS-retrieved near-surface optical properties of the ocean, Applied Optics, Jan. 20, 2001, vol. 40, No. 3, Optical Society of America.
Gordon, Remote sensing of ocean color: a methodology for dealing with broad spectral bands and significant out-of-band response, Applied Optics, Dec. 20, 1995, vol. 34, No. 36, Optical Society of America.

* cited by examiner

METHOD OF OUT-OF-BAND CORRECTION FOR MULTISPECTRAL REMOTE SENSING

CROSS-REFERENCE TO RELATED APPLICATIONS

The present application claims priority to U.S. Provisional Patent Application Ser. No. 61/674,954, which was filed on 24 Jul. 2012. Additionally, the present application is a continuation-in-part application of U.S. patent application Ser. No. 13/862,539, which was filed 15 Apr. 2013.

FIELD OF THE INVENTION

The invention relates generally to a method of image processing, and more particularly to a method of multispectral decomposition for the removal of out-of-hand effects.

BACKGROUND OF THE INVENTION

Multispectral remote sensing images are acquired from aircraft and satellites. To quantify ground surface characteristics, the measured spectral radiances must be converted into target reflectance. In these applications, accurate and consistent sensor calibration is essential. Out-Of-Band ("OOB") response is defined as the ratio of integrated response outside the one percent of peak response points of a spectral band to the integrated response inside the one percent points. Several multispectral radiometric instruments are known to exhibit significant radiance contribution from OOB spectral response.

The typical scale of OOB spectral response is in the range of several percent, which can, for example, result in chlorophyll retrievals that are biased high for clear water by OOB response to short wavelengths. A methodology to dealing with the OOB response had been suggested and adopted for SeaWiFS calibration. These calibration methods adjust the measured radiances to correct for OOB response for ease of comparison to in situ measured multispectral radiances. The SeaWiFS correction scheme has been successfully applied to data products retrieved over Case 1 ocean waters. "Case 1" ocean waters are those for which the inherent optical properties are determined primarily by phytoplankton and co-varying chromophoric dissolved organic matter ("CDOM") and detritus. However, the correction scheme is inherently not useable for SeaWiFS data product corrections over Case 2 turbid waters or over land.

The first VIIRS instrument, Flight Unit 1 ("FU1"), now flying on the NPP satellite platform, has known performance issues. Seven channels located between 0.4 and 0.9 µm in the VisNIR focal plane have problems related to OOB responses, i.e., small amounts of radiance far away from the center of a given channel that pass through the filter and reach the detector. The newly launched VIIRS instrument requires developing highly accurate operational calibration procedures and algorithms to process VIIRS data.

BRIEF SUMMARY OF THE INVENTION

An embodiment of the invention includes a method of recovering the in-band multispectral radiances and addressing the issues of the OOB response. For a particular multispectral channel, other channels provide measurements of spectral regions that contribute OOB radiance. This crosstalk between multispectral channels provides a possibility for correction. The new approach is based on the decomposition principle to recover the average narrowband signals from uncorrected signals using filter transmittance functions instead of the calibration methods.

In this alternative embodiment of the invention, using the laboratory-measured filter transmittance functions for all multiband channels, an out-of-band correction transform ("OBCT") matrix for recovering in-band spectral radiances is derived. For an N-channel multispectral sensor, OOB effects are corrected b applying an N×N OBCT matrix to the measured signals.

DETAILED DESCRIPTION OF THE INVENTION

Figure 1:
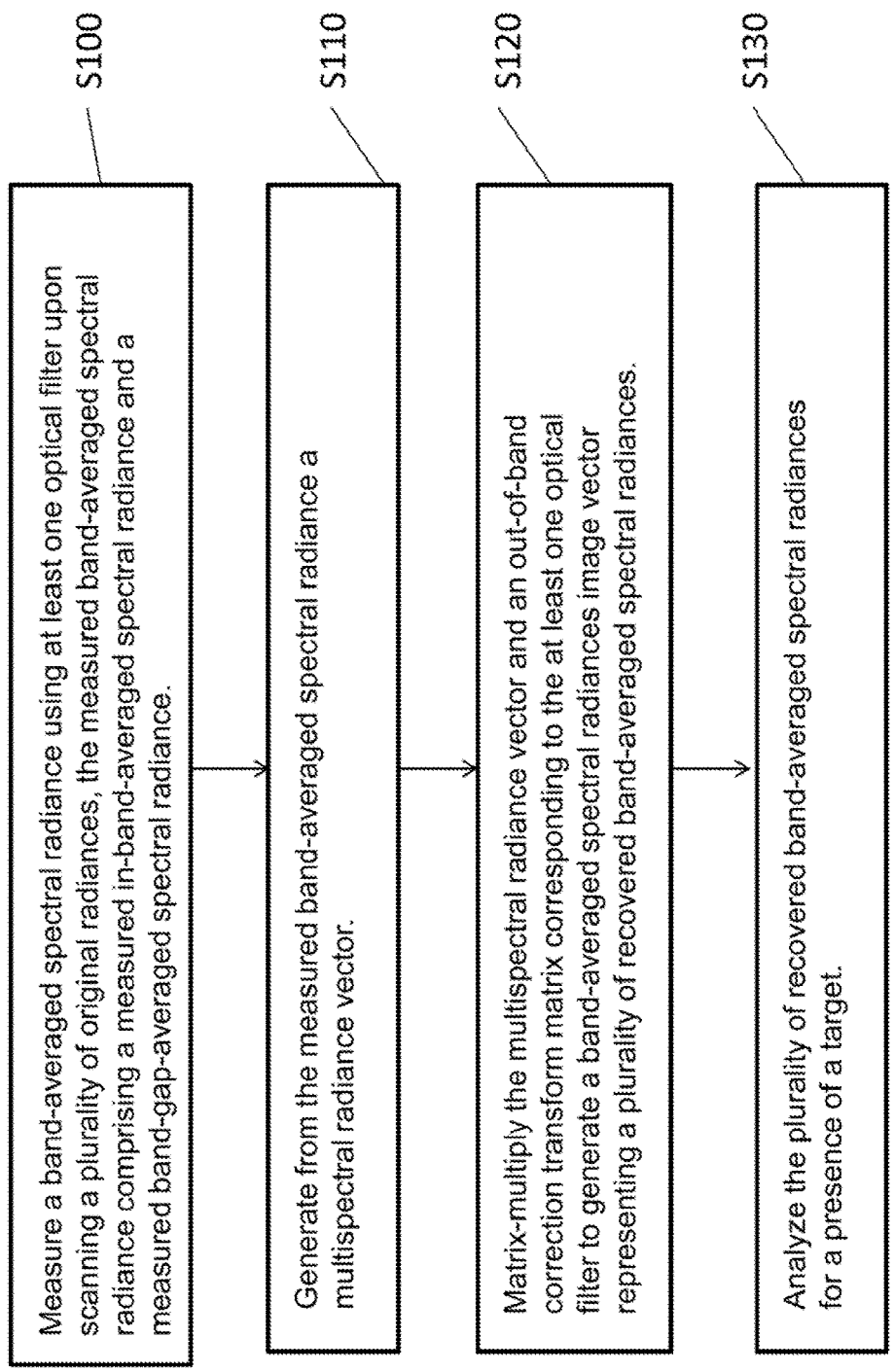
FIG. 1 is a flow chart of an illustrative method embodiment of the instant invention.
Figure 2A:
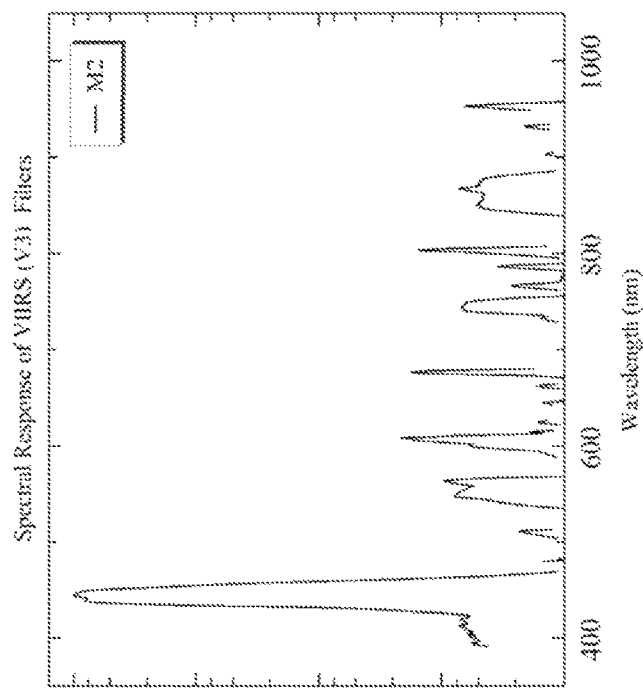
FIGS. 2A-2G are graphs of VIIRS version 3 M1-M7 filter transmittance curves, respectively, normalized at the peaks.
Figure 2B:
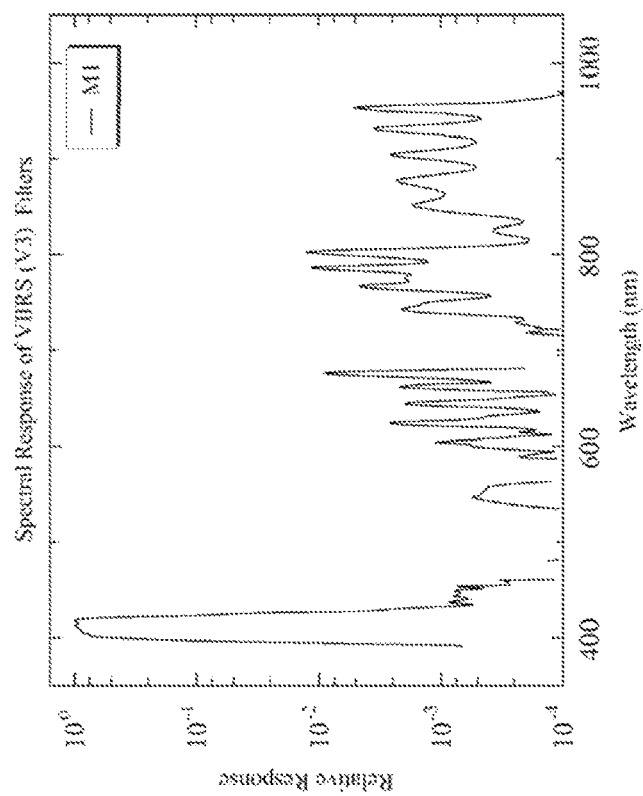
Figures 2C, 2D:
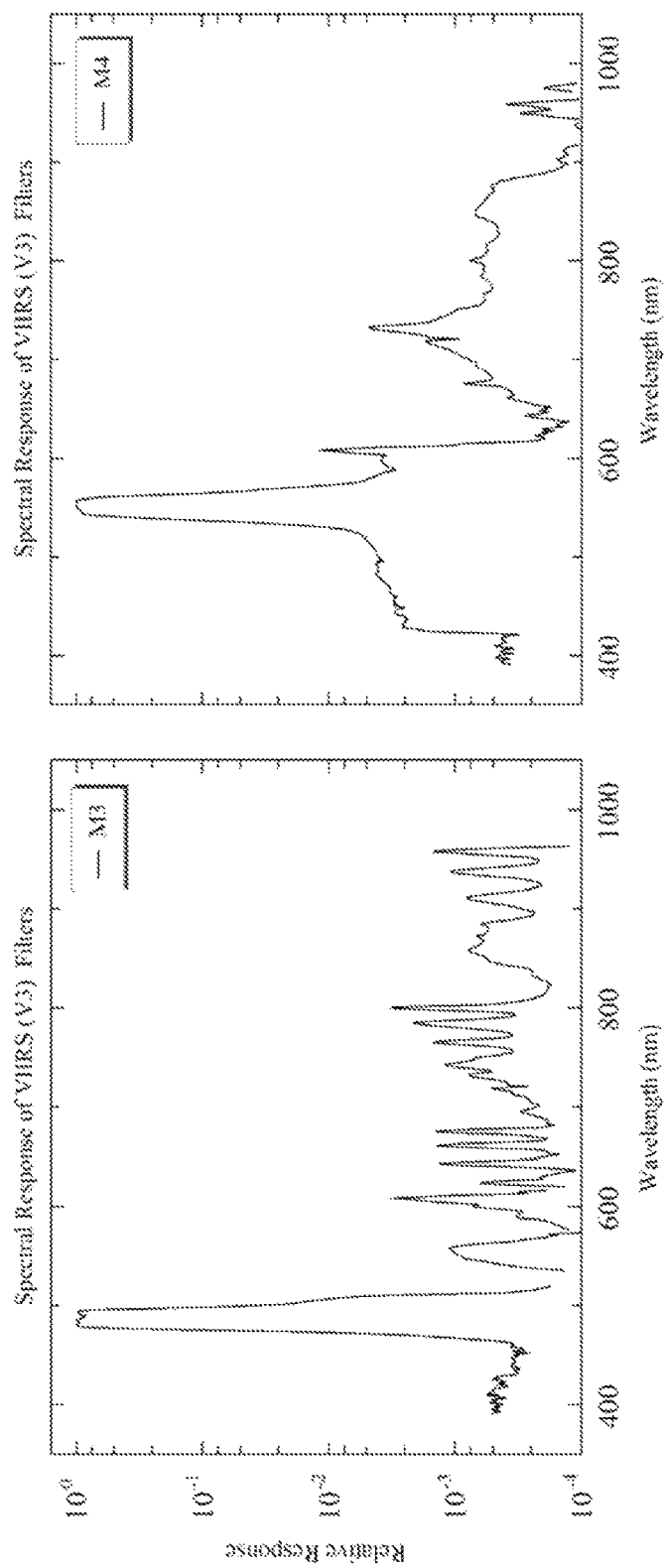
Figure 2E:
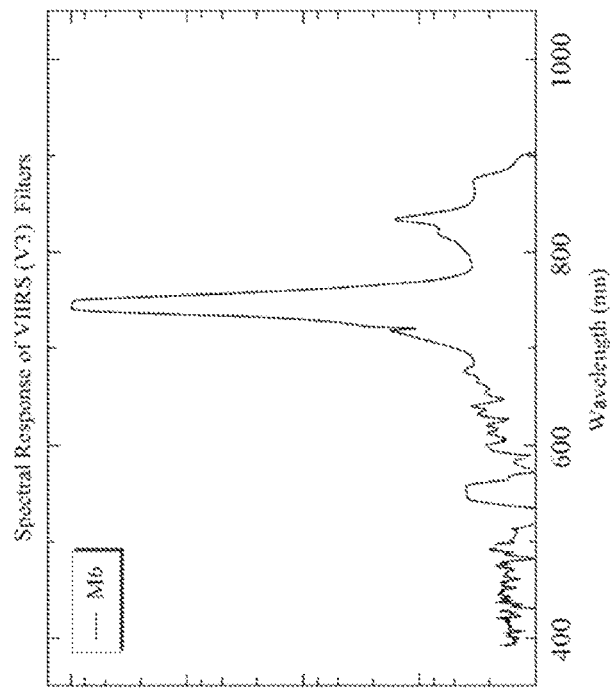
Figure 2F:
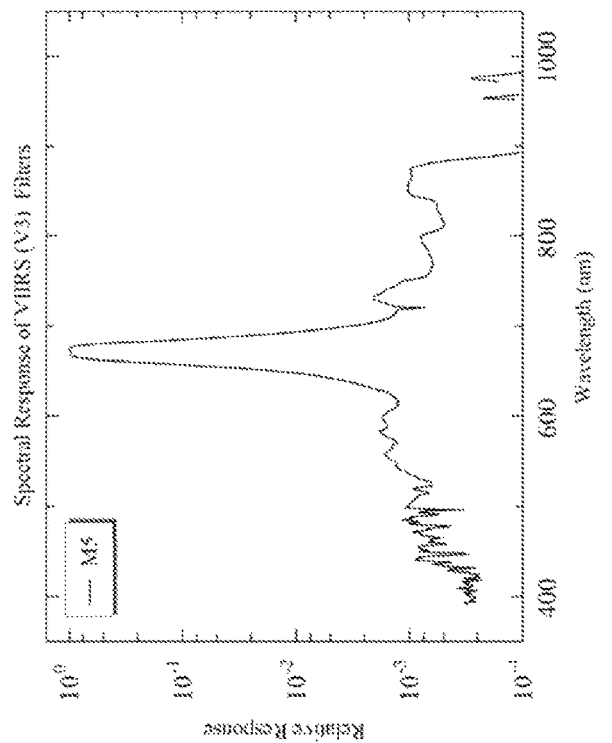
Figure 2G:
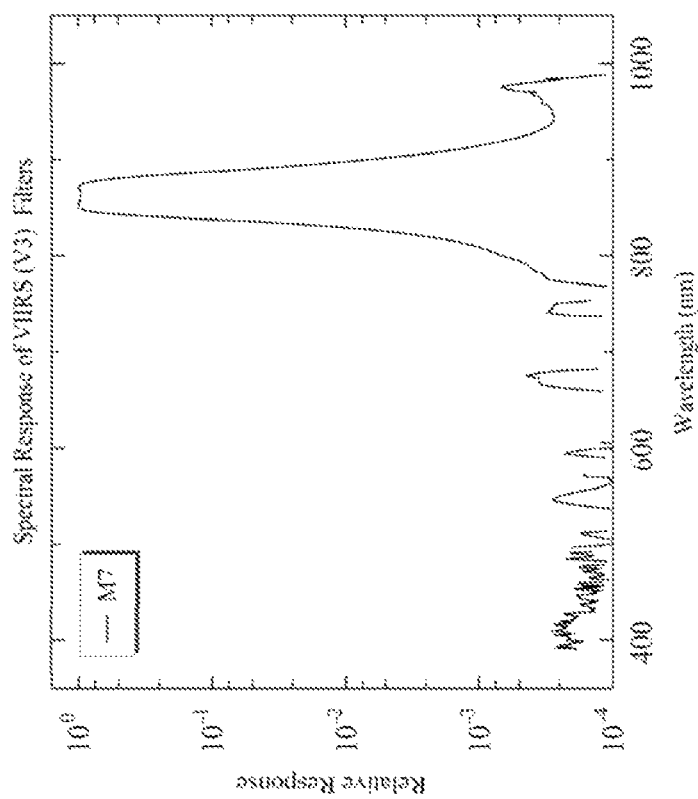

An embodiment of the invention includes a method described as follows, with reference to FIG. 1. A band-averaged spectral radiance is measured using at least one optical filter upon scanning a plurality of original radiances, as in Step S100. The measured band-averaged spectral radiance includes a measured in-band-averaged spectral radiance and a measured band-gap-averaged spectral radiance. A multispectral radiance vector is generated from the measured band-averaged spectral radiance, as in Step S110. The multispectral radiance vector and an out-of-band correction transform matrix corresponding to the at least one optical filter are matrix-multiplied to generate a band-averaged spectral radiances image vector representing a plurality of recovered hand-averaged spectral radiances, as in Step S120. The plurality of recovered band-averaged spectral radiances is analyzed for a presence of a target, as h Step S130. Illustrative targets include any matter, such as, ocean features or land features).

Optionally, the at least one optical filter resides on one an aircraft and a satellite.

Optionally, the hand-averaged spectral radiance includes a VIIRS hand-averaged spectral radiance.

Another embodiment of the invention includes a method described as follows. A band-averaged spectral radiance is measured using at least one optical filter, upon scanning a plurality of original radiances, the measured total band-averaged spectral radiance, $\hat{s}_k = \hat{s}_k(i, j) = \int_{\lambda \in \{\Delta \lambda_j\}} h_k(\lambda) s(\lambda) d\lambda + \int_{\lambda \notin \{\Delta \lambda_j\}} h_k(\lambda) s(\lambda) d\lambda$, where i and j are pixel indexes, comprising a measured in-band-averaged spectral radiance and a measured band-gap-averaged spectral radiance, the measured total band-averaged spectral radiance comprising a plurality of k wavelength sub-ranges, the plurality of wavelength sub-ranges comprising a plurality of k in-band sub-ranges and a plurality a plurality of k band-gap sub-ranges, wherein a measured kth in-band band-averaged spectral radiance is represented as $$\int_{\lambda \in \{\Delta \lambda_l\}} h_k(\lambda) s(\lambda) d\lambda \approx \sum_{l=1}^{N} \bar{h}_{kl}^{(in)} \Delta \lambda_l \bar{s}_l,$$

where N is a number of a plurality of bands, $\bar{h}_{kl}^{(in)}$ is an average of a plurality of filter response functions, $\Delta\lambda_l$ is a width of partitioned sub-band, and $\bar{s}_l$ is a recovered lth band-average spectral radiance that is an average of all measured signals within the sub-band $\Delta\lambda_l$, and free of an out-of-band effect, wherein a measured k-th band-gap band-averaged spectral radiance is represented as $$\int_{\lambda \notin \{\Delta\lambda_l\}} h_k(\lambda)\hat{s}(\lambda)d\lambda \approx \sum_{l=1}^{N} b_{kl}\hat{s}_l,$$

where $$b_{kl} = \begin{cases} (\lambda_{min}^{(1)} - \lambda_{min})\overline{h}_{k,0}^{(out)} + \frac{\lambda_{min}^{(2)} - \lambda_{max}^{(1)}}{\lambda_2 - \lambda_1}(\lambda_2 \overline{h}_{k,1}^{(out)} - \overline{h\lambda}_{k,1}^{(out)}) & (l=1) \\ \frac{\lambda_{min}^{(l)} - \lambda_{max}^{(l-1)}}{\lambda_l - \lambda_{l-1}}(\overline{h\lambda}_{k,l-1}^{(out)} - \lambda_{l-1}\overline{h}_{k,l-1}^{(out)}) + \\ \frac{\lambda_{min}^{(l+1)} - \lambda_{max}^{(l)}}{\lambda_{l+1} - \lambda_l}(\lambda_{l+1}\overline{h}_{kl}^{(out)} - \overline{h\lambda}_{kl}^{(out)}) & (1 < l < N), \\ \frac{\lambda_{min}^{(N)} - \lambda_{max}^{(N-1)}}{\lambda_N - \lambda_{N-1}}(\overline{h\lambda}_{k,N-1}^{(out)} - \lambda_{N-1}\overline{h}_{k,N-1}^{(out)}) + \\ (\lambda_{max} - \lambda_{max}^{(N)})\overline{h}_{kN}^{(out)} & (l=N) \end{cases}$$

$$\overline{h\lambda}_{kl}^{(out)} = \frac{\int_{\lambda_{(max)}^{(l)}}^{\lambda_{min}^{(l+1)}} h_k(\lambda)\lambda d\lambda}{\lambda_{min}^{(l+1)} - \lambda_{max}^{(l)}},$$

and $$\overline{h}_{kl}^{(out)} = \frac{\int_{\lambda_{(max)}^{(l)}}^{\lambda_{min}^{(l+1)}} h_k(\lambda)d\lambda}{\lambda_{min}^{(l+1)} - \lambda_{max}^{(l)}}.$$

A multispectral radiance vector is generated from the measured band-averaged spectral radiance. The multispectral radiance vector and an out-of-hand correction transform matrix corresponding to the at least one optical filter are matrix-multiplied to generate a band-averaged spectral radiances image vector representing a plurality of recovered ba id-averaged spectral radiances. The plurality of recovered band-averaged spectral radiances are outputted, thereby generating a plurality of recovered radiances free of out-of-band effects.

Optionally, wherein each in-hand sub-range of the plurality of k in-band sub-ranges comprises an in-band width and each band-gap sub-ranges of the plurality of k in-band sub-ranges includes an hand-gap width, wherein the at least one optical filter comprises at least one filter transmittance function, wherein the plurality of sub-ranges comprises at least one in-band partition parameter, and wherein the multispectral decomposition transform matrix is a function of at least one of the at least one filter transmittance function the at least one partition parameter, and a position of the at least one optical filter.

Optionally, the at least one optical filter comprises a number of multi-bands, the number of multi-bands being equal to a number of the plurality of sub-ranges.

Optionally, the recovered and measured band-averaged spectral radiance vector are represented as $$\bar{s} = \begin{pmatrix} \bar{s}_1 \\ \bar{s}_2 \\ \dots \\ \bar{s}_N \end{pmatrix}, \text{ and } \hat{s} = \begin{pmatrix} \hat{s}_1 \\ \hat{s}_2 \\ \dots \\ \hat{s}_N \end{pmatrix}$$

wherein each components $\bar{s}_n$ and $\hat{s}_n$ of the recovered and measured band-averaged spectral radiance vectors are single band images.

Optionally, the band-averaged spectral radiance image vector is represented $\bar{s}=T\hat{s}$, wherein the out-of-band correction transform matrix T is defined by $$T = A^{-1}(I-B),$$

wherein matrix $A = (\bar{h}_{kl}^{(in)}\Delta\lambda_l)$ and matrix) are N×N, wherein matrix I is a N×N identity matrix, wherein $\hat{s}$ is the measured band-averaged spectral radiance vector.

Optionally, wherein the band-averaged spectral radiance comprises a VIIRS band-averaged spectral radiance.

An embodiment of the invention is described as follows.

Put-Of-Band Correction Transform

Multiband Radiometric Instrument

VIIRS is a typical multispectral remote sensing instrument. Through various laboratory tests of the first VIIRS instrument, it has been found that the seven channels located between 0.4 and 0.9 μm (M1-M7) in the VisNIR focal plane have problems with OOB responses. A set of VIIRS (Version 3) M1-M7 filter transmittance curves (normalized at the peak of the filter transmission) is shown in FIGS. 3A-3G. The VIIRS filter data are available from the public domain website hap://www.star.nesdis.noaa.giov/jpss/index.php. The M1 and M4 filter curves peak at wavelengths below 0.6 μm on the left side of the plot, and both have significant transmittances in the far distant. "wing" region above 0.6 μm.

The VIIRS VisNIR channel names, positions, and widths are listed in Table 1 below. Many VIIRS channels (designated as M1 to M7 in Table 1) have heritages to the MODIS instrument but with minor differences in center positions and widths.

TABLE 1

VIIRS VisNIR CHANNEL NAMES, POSITIONS, AND FULL WIDTHS AT HALF MAXIMUM (FWHMS).

| VIIRS Channel | λ (μm) | FWHM (μm) |
| --- | --- | --- |
| M1 | 0.412 | 0.020 |
| M2 | 0.445 | 0.018 |
| M3 | 0.488 | 0.020 |
| M4 | 0.555 | 0.020 |
| M5 | 0.672 | 0.020 |
| M6 | 0.746 | 0.015 |
| M7 | 0.865 | 0.039 |

The causes for the OOB response with VIIRS M1-M7 channels are now fully understood. The main cause for the OOB response is associated with high-angle scattering in the integrated filter assembly that overlies the VisNIR focal plane array. The scattering mechanism causes the OOB effects for a given channel to come from a broad spectral range, instead of a few narrow spectral intervals.

A. Linear Optical System

In general, a multi-spectral instrument such as VIIRS is considered to be a system that accepts an input, and produces an output. Such a system is linear, because the measured optical single band signal $[\hat{s}_k=\hat{s}_k(i,j)$, where i and j are pixel indexes] from a sensor with the $k^{th}$ band filter on a pixel can be expressed by $$\hat{s}_k = \int_{\lambda_{min}}^{\lambda_{max}} h_k(\lambda)s(\lambda)d\lambda, \quad (1)$$

where $\hat{s}_k$ and $s(\lambda)$ are a measured band-averaged spectral radiances (with OOB effects) and original radiances, respectively, and $h_k(\lambda)$ are the spectral response functions of the optical system (filters) with the wavelength $\lambda \in (\lambda_{min}, \lambda_{max})$ as a variable, where $(\lambda_{min}, \lambda_{max})$ is, for VIIRS, the entire VisNIR spectral range. The spectral response functions $h_k(\lambda)$ are normalize(between the full range wavelength $\lambda_{min}$ and $\lambda_{max}$ as follows $$\int_{\lambda_{min}}^{\lambda_{max}} h_k(\lambda)d\lambda = 1. \quad (2)$$

The above superposition integral expresses a relationship between original and measured signals with the optical filters.

Figure 3A:
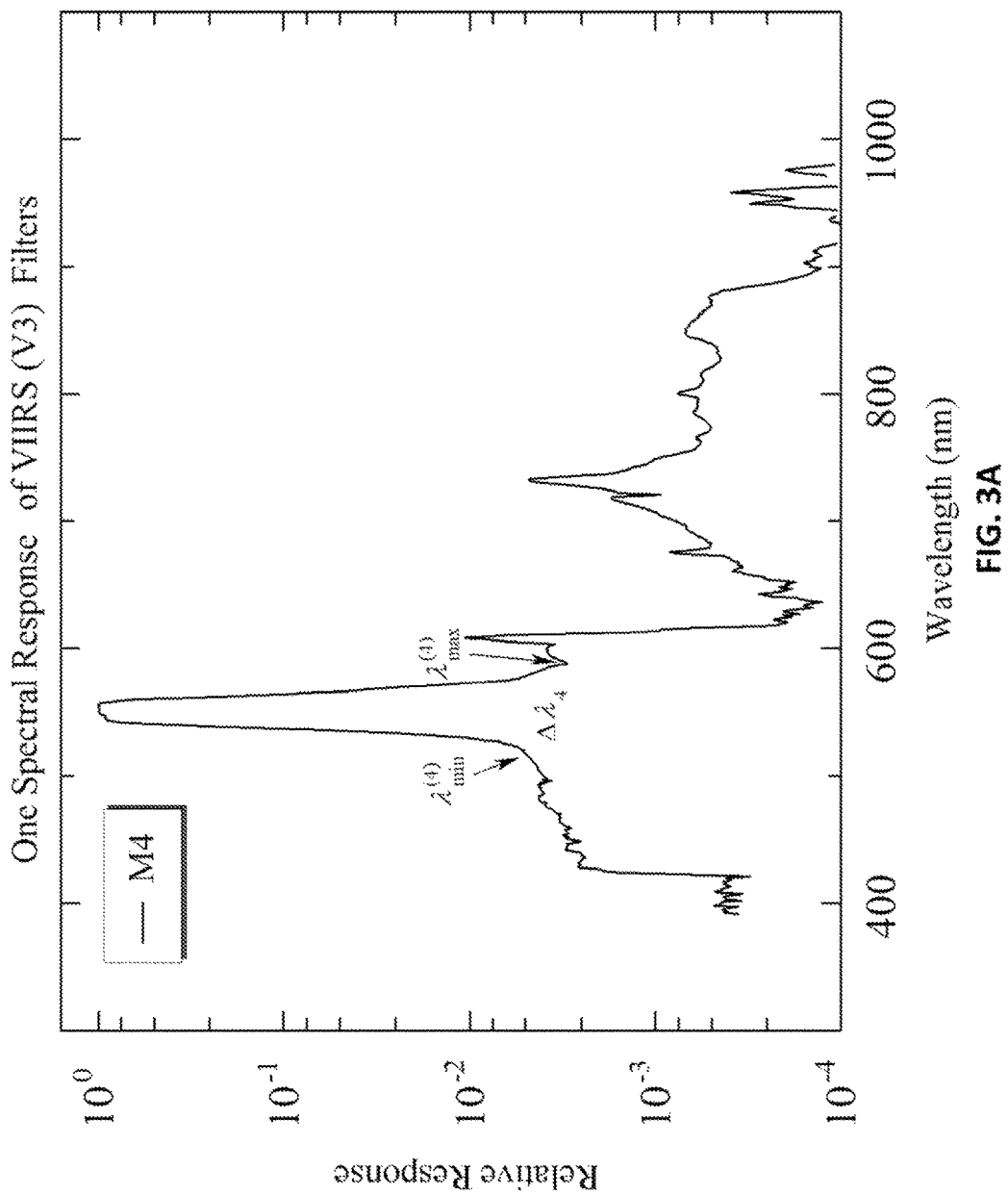
FIGS. 3A and 3B are graphs showing an in-band wavelength range and band minimum and maximum wavelength positions for normalized-to-peak VIIRS M4 and M6 filter transmittance curves, respectively.
Figure 3B:
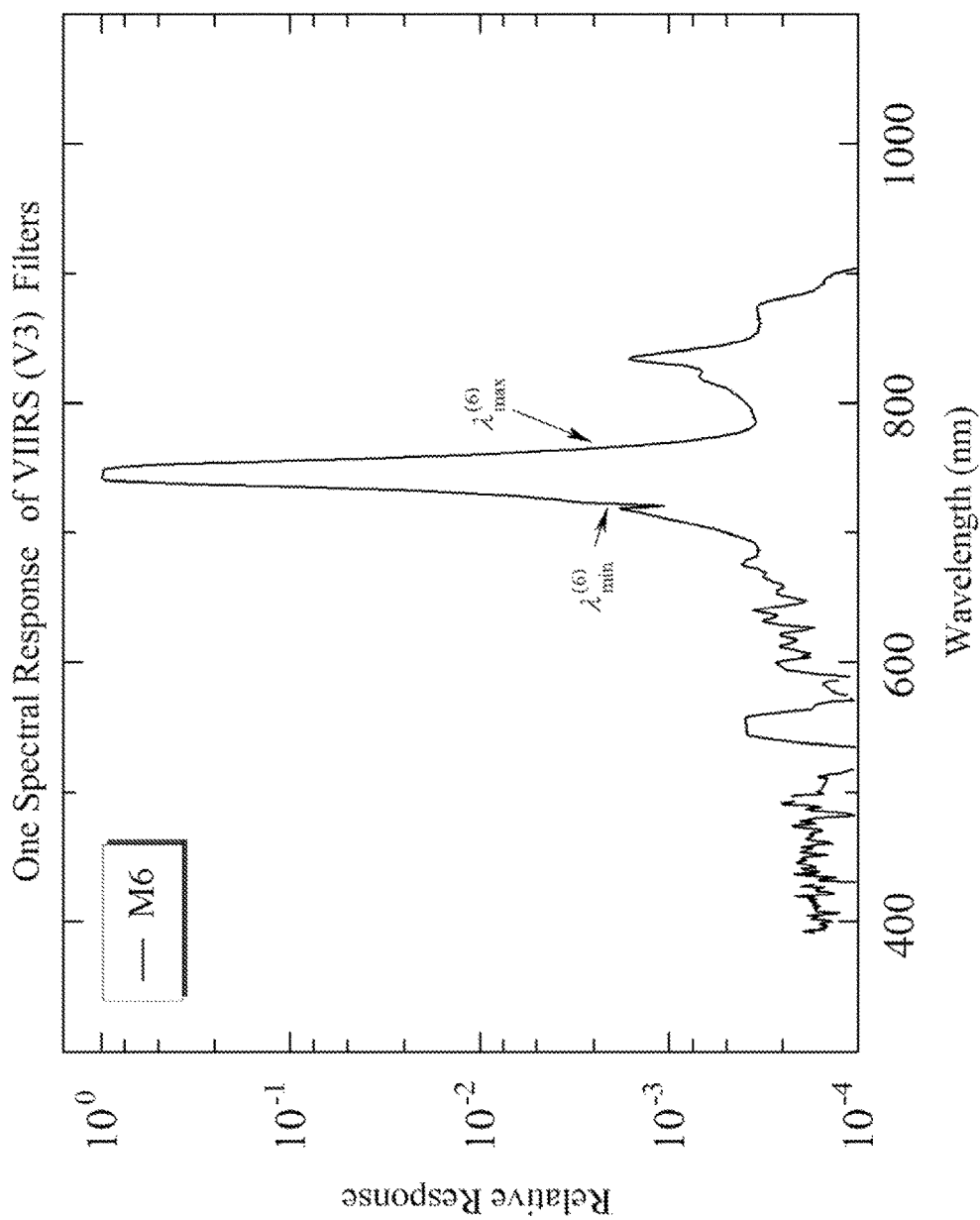

The full range integral in equation (1) between the cut-off wavelengths $\lambda_{min}$ and $\lambda_{max}$ can be partitioned by two parts in which the wavelength ranges cover in-band (narrow bandwidths with nominal band centers $\lambda_k$ in Table 1) regions and band-gap regions between in-band regions, respectively. If the in-band wavelength width $\Delta\lambda_1 = \zeta_{max}^{(1)} - \lambda_{min}^{(1)}$ is defined by a spectral response function as shown in FIGS. 3A and 3B, the integral in (1) becomes $$\hat{s}_k = \int_{\lambda \in \{\Delta\lambda_l\}} h_k(\lambda)s(\lambda)d\lambda + \int_{\lambda \notin \{\Delta\lambda_l\}} h_k(\lambda)s(\lambda)d\lambda, \quad (3)$$

where $\{\Delta\lambda_l\} = (\Delta\lambda_1, \Delta\lambda_2, \ldots, \Delta\lambda_N)$ denotes the in-band range of all channels, and N is the number of filters. The bandwidths $\Delta\lambda_l$ are not the same bandwidths defined in Table 1. The bandwidths $\Delta\lambda_l$ are usually selected to be slightly greater than bandwidths for which the response is inside the 1% of peak response points, and depend on characteristics of the response functions of the filters.

In-Band Partitions

If the number of filters is equal to N, then the in-band integral in equation (3) is given by $$\int_{\lambda \in \{\Delta\lambda_l\}} h_k(\lambda)s(\lambda)d\lambda = \sum_{l=1}^{N} \int_{\lambda_{min}^{(l)}}^{\lambda_{max}^{(l)}} h_k(\lambda)s(\lambda)d\lambda. \quad (4)$$

Using an average value of the response function between $\lambda_{min}^{(1)}$ and $\lambda_{max}^{(1)}$ to replace the response function $h_k(\lambda)$ in the integral, we have $$\int_{\lambda_{min}^{(l)}}^{\lambda_{max}^{(l)}} h_k(\lambda)s(\lambda)d\lambda \approx \bar{h}_{kl}^{(in)} \int_{\lambda_{min}^{(l)}}^{\lambda_{max}^{(l)}} s(\lambda)d\lambda = \bar{h}_{kl}^{(in)} \Delta\lambda_l \bar{s}_l, \quad (5)$$

where $\Delta\lambda_l = \lambda_{max}^{(1)} - \lambda_{min}^{(1)}$ and the average of the response functions is given by $$\bar{h}_{kl}^{(in)} = \frac{1}{\Delta\lambda_l} \int_{\lambda_{min}^{(l)}}^{\lambda_{max}^{(l)}} h_k(\lambda)d\lambda,$$

and the in-band signal $[\bar{s}_l = \bar{s}_l(i, j)$ where i and j are pixel indexes] for a particular band that is an average of all signals within the sub-band $\Delta\lambda_l$ defined by $$\bar{s}_l = \frac{1}{\Delta\lambda_l} \int_{\lambda_{min}^{(l)}}^{\lambda_{max}^{(l)}} s(\lambda)d\lambda. \quad (6)$$

The approximation in (5) holds exactly when a response of a filter is an ideal pulse function. The error of the approximation in (5) depends on the shape of a response function and the width of in-band partition.

The measured $k^{th}$ in-band integrated signal in (4) is a summation of all average in-band signals that is given by $$\int_{\lambda \in \{\Delta\lambda_l\}} h_k(\lambda)s(\lambda)d\lambda \approx \sum_{l=1}^{N} \bar{h}_{kl}^{(in)} \Delta\lambda_l \bar{s}_l. \quad (7)$$

The mean values $\bar{s}_1$ between $\lambda_{min}^{(1)}$ and $\lambda_{max}^{(1)}$ are the in-band signals we want to recover. The uncorrected (measured) signal is a superposition of all in-band and band-gap signals. All coefficient factors and parameters in equation (7) can be determined by the response functions that are dependent on the characteristics of the filters for a particular instrument.

Band-Gap Partitions

To deal with the band-gap integral in equation (3), we consider that the $k^{th}$ in-band spectral responses are much greater than the band-gap responses as shown in FIG. 1, e.g.

$$h_k(\lambda)(\lambda \in \Delta\lambda_k) >> h_k(\lambda)(\lambda \notin \Delta\lambda_k) \quad (8)$$

The measured signal in the band-gap integral can be interpolated linearly using the two nearest average bands [9] with nominal band centers $\lambda_l$ in Table 1 above.

$$\hat{s}(\lambda) = \hat{s}_l \frac{(\lambda_{l+1} - \lambda)}{(\lambda_{l+1} - \lambda_l)} + \hat{s}_{l+1} \frac{(\lambda - \lambda_l)}{(\lambda_{l+1} - \lambda_l)} \quad (\lambda_l \le \lambda < \lambda_{l+1}). \quad (9)$$

Assuming that the error between the $k^{th}$ band measured and original images is given by $$\epsilon(\lambda) = \hat{s}(\lambda) - s(\lambda),$$

the band-gap integral in equation (3) becomes $$\int_{\lambda \notin \{\Delta\lambda_l\}} h_k(\lambda)s(\lambda)d\lambda = \int_{\lambda \notin \{\Delta\lambda_l\}} h_k(\lambda)[\hat{s}(\lambda) + O(\epsilon)]d\lambda \approx \int_{\lambda \notin \{\Delta\lambda_l\}} h_k(\lambda)\hat{s}(\lambda)d\lambda. \quad (10)$$

If we define $\lambda_{max}^{(0)} = \lambda_{min}$ and $\lambda_{min}^{(N+1)} = \lambda_{max}$, and $\hat{s}(\lambda) = \hat{s}(\lambda_{min}^{(1)})$ $(\lambda_{min} \le \lambda \le \lambda_{min}^{(1)})$ and $\hat{s}(\lambda) = \hat{s}(\lambda_{max}^{(N)})$ $(\lambda_{max}^{(N)} \le \lambda \le \lambda_{max})$, then the band-gap integral (10) using the interpolation (9) can be formulated by $$\int_{\lambda \notin \{\Delta\lambda_l\}} h_k(\lambda)\hat{s}(\lambda)d\lambda \approx \sum_{l=1}^{N} b_{kl}\hat{s}_l,$$

where $$b_{kl} = \begin{cases} (\lambda_{min}^{(1)} - \lambda_{min})\bar{h}_{k,0}^{(out)} + \frac{\lambda_{min}^{(2)} - \lambda_{max}^{(1)}}{\lambda_2 - \lambda_1}(\lambda_2 \bar{h}_{k,1}^{(out)} - \overline{h\lambda}_{k,1}^{(out)}) & (l=1) \\ \frac{\lambda_{min}^{(l)} - \lambda_{max}^{(l-1)}}{\lambda_l - \lambda_{l-1}}(\overline{h\lambda}_{k,l-1}^{(out)} - \lambda_{l-1}\bar{h}_{k,l-1}^{(out)}) + \\ \frac{\lambda_{min}^{(l+1)} - \lambda_{max}^{(l)}}{\lambda_{l+1} - \lambda_l}(\lambda_{l+1}\bar{h}_{kl}^{(out)} - \overline{h\lambda}_{kl}^{(out)}) & (1 < l < N), \\ \frac{\lambda_{min}^{(N)} - \lambda_{max}^{(N-1)}}{\lambda_N - \lambda_{N-1}}(\overline{h\lambda}_{k,N-1}^{(out)} - \lambda_{N-1}\bar{h}_{k,N-1}^{(out)}) + \\ (\lambda_{max} - \lambda_{max}^{(N)})\bar{h}_{kN}^{(out)} & (l=N) \end{cases}$$

-continued $$\overline{h\lambda}_{kl}^{(out)} = \frac{\int_{\lambda_{(max)}^{(l)}}^{\lambda_{min}^{(l+1)}} h_k(\lambda)\lambda d\lambda}{\lambda_{min}^{(l+1)} - \lambda_{max}^{(l)}},$$

and $$\overline{h}_{kl}^{(out)} = \frac{\int_{\lambda_{(max)}^{(l)}}^{\lambda_{min}^{(l+1)}} h_k(\lambda)d\lambda}{\lambda_{min}^{(l+1)} - \lambda_{max}^{(l)}}.$$

The linear approximation (9) between two nearest bands may cause a large error if real original signals m band-gap are far away from the linear approximation curve. Fortunately, this error of signal in band-gap is not our detected in-band signal and is convolved by a very low level response function in the band-gap domain. The error in the hand-gap integral can be ignored comparing with the in-hand integral in statistics since the properties of the responses between in-hand and band-gap domains in (9) hold for most cases.

Similarly, as in the above subsection, all coefficients $b_{ki}$ and parameters $\lambda_{min}^{(1)}$ and $\lambda_{min}^{(1)}$ in equation (11) can h determined and selected based on the response functions that are dependent on the characteristics of the filters for a particular instrument. We can adjust widths of the band-gap from zero to certain values for different optical instrument As shown in FIGS. 2A-2G, the widths of the band-gaps from M1 to M3 can be chosen as zero or smaller values, and larger widths of the band gaps from M4 to M7 can improve the performance of the OOB correction for the VIIRS spectrometer.

Out-of-Band Correction Transform

Two terms of the in-band and band-gap integrals in equation (3) are formulated by equations (7) and (11). Then equation (3) can be rewritten as $$\sum_{l=1}^{N} \overline{h}_{kl}^{(in)} \Delta\lambda_l \overline{s}_l = \hat{s}_k - \sum_{l=1}^{N} b_{kl} \hat{s}_l. \quad (12)$$

According to an embodiment of the instant invention, it is necessary to find the average in-band signals $\overline{s}_i$ twin the equation (12), in matrix form, (12) is $$\begin{pmatrix} \sum_{l=1}^{N} \overline{h}_{1l}^{(in)} \Delta\lambda_l \overline{s}_l \\ \sum_{l=1}^{N} \overline{h}_{2l}^{(in)} \Delta\lambda_l \overline{s}_l \\ \cdots \\ \sum_{l=1}^{N} \overline{h}_{Nl}^{(in)} \Delta\lambda_l \overline{s}_l \end{pmatrix} = \begin{pmatrix} \hat{s}_1 - \sum_{l=1}^{N} b_{1l} \hat{s}_l \\ \hat{s}_2 - \sum_{l=1}^{N} b_{2l} \hat{s}_l \\ \cdots \\ \hat{s}_n - \sum_{l=1}^{N} b_{Nl} \hat{s}_l \end{pmatrix}$$

or $$A\overline{s} = (I - B)\hat{s},$$

where $$\overline{s} = \begin{pmatrix} \overline{s}_1 \\ \overline{s}_2 \\ \cdots \\ \overline{s}_N \end{pmatrix} \text{ and } \hat{s} = \begin{pmatrix} \hat{s}_1 \\ \hat{s}_2 \\ \cdots \\ \hat{s}_N \end{pmatrix},$$

matrixes $A=(\overline{h}_{kj}^{(in)}\Delta\lambda_1)$ and $B=(b_{ki})$ are N×N, and I is a N×N identity matrix. If the OBCT matrix T is defined by $$T = A^{-}(I-B), \quad (11)$$

then the image by the OOB correction transform is given by $$\overline{s} = T\hat{s}. \quad (14)$$

Equation (14) is a linear transform between the uncorrected and corrected multispectral image vectors.

The narrow-hand multispectral signals can be recovered from the measured multispectral signals, which contain OOB effects. The decomposition operation can be simply performed by a product between a fixed OBCT matrix and a measured multispectral image vector. All elements of the OBCT matrix T depend on the response functions of filters, in-band widths, and nominal band centers of the filters. Therefore, the OBCT matrix can be fully determined by the characteristics of the filters for a particular multispectral radiometric instrument.

In the special case in which all filters are ideal, the normalized response functions of the filters for the total wavelength range from $\lambda_{min}$ to $\lambda_{max}$ are given by $$h_k(\lambda) = \frac{1}{\Delta\lambda_l} \begin{cases} 1 & \lambda_{min}^{(l)} \leq \lambda \leq \lambda_{max}^{(l)} \\ 0 & \text{otherwise.} \end{cases}$$

Using the spectral response function of the ideal filters, we found that matrix B=0, A=I, and the OBCT matrix T is an identity matrix. The input and output signals are identical in this ideal system.

VIIRS OBCT Matrix

Using equation (11), the recovered in-band signals can be calculated by the OBCT matrix and the uncorrected multi-channel image vector. In this section we are concerned with a numerical computation of the OBCT matrix for the VIIRS instrument.

The VIIRS instrument is, in many aspects, similar to the Moderate Resolution Imaging Spectroradiometer (MODIS) instruments currently on board the NASA Terra and Aqua Spacecrafts. Many VIIRS channels have heritages to the MODIS instrument, but with minor differences in center positions and widths. Important differences between VIIRS and MODIS do exist. For example, VIIRS has five relatively broad imaging channels at a high spatial resolution of about 375 m.

All seven channel VIIRS filter transmittance functions shown in FIG. 1 indicate that the filter bandwidths and positions are not uniform. The transmittance functions of the VIIRS filters in FIG. 1 are normalized to I at peak, points. All response functions defined in equation (1) and (3) must be normalized to an integral value of 1, as in Eq. (2), using the transmittance functions of the VIIRS filters in FIG. 1 before a computation for the OBCT matrix. The normalized response functions $h_k(\lambda)$ are given by $$h_k(\lambda) = \frac{H_k(\lambda)}{\int_{\lambda_{min}}^{\lambda_{max}} H_k(\lambda) d\lambda},$$

where $H_k(\lambda)$ are the transmittance functions of the VIIRS filters in FIG. 1 between wavelength range from $\lambda_{min}$ to $\lambda_{max}$.

The OBCT (7×7) matrix T fur the VIIRS instrument based on the wavelength in-band and band-Rap partitions and the transmittance functions of the filters in FIG. 1 is given by $$\begin{pmatrix} 1.0287 & -1.70827\times10^{-3} & -1.09021\times10^{-4} & -5.55824\times10^{-4} & -5.29429\times10^{-3} & -2.75953\times10^{-3} & -1.82264\times10^{-2} \\ -1.66515\times10^{-3} & 1.00991 & -7.51183\times10^{-4} & -1.41192\times10^{-3} & -2.18476\times10^{-3} & -9.52121\times10^{-4} & -2.93506\times10^{-3} \\ -9.18167\times10^{-4} & -6.31394\times10^{-4} & 1.01375 & -1.41432\times10^{-3} & -3.21069\times10^{-3} & -1.78773\times10^{-3} & -5.77032\times10^{-3} \\ -1.0098\times10^{-3} & -4.86908\times10^{-3} & -1.21268\times10^{-2} & 1.03442 & -8.3853\times10^{-3} & -4.17362\times10^{-3} & -3.85384\times10^{-3} \\ -5.4833\times10^{-4} & -1.07026\times10^{-3} & -2.30808\times10^{-3} & -4.43472\times10^{-3} & 1.01667 & -3.45863\times10^{-3} & -4.84276\times10^{-3} \\ -4.20704\times10^{-4} & -4.19931\times10^{-4} & -6.07297\times10^{-4} & -9.42082\times10^{-4} & -3.10139\times10^{-3} & 1.01041 & -4.91217\times10^{-3} \\ -2.15101\times10^{-4} & -1.42594\times10^{-4} & -1.81492\times10^{-4} & -1.91647\times10^{-4} & -3.3216\times10^{-4} & -1.56788\times10^{-4} & 1.00124 \end{pmatrix}$$

All main diagonal elements in the OBCT matrix for the VIIRS instrument are greater than but close to one. And all non-diagonal elements of the OBCT Matrix are negative because the uncorrected signal for a particular hand is a superposition of all in-band and OOB signals. The corrected signal must be extracted from the superposition signals. The correction amounts are dependent on the characteristics of the filters. The first and fourth main diagonal elements with larger correction amounts (relative errors≈2.9% and 3.5%) in the OBCT matrix correspond to poor filters such as band 1 and 4 as shown in FIGS. 2A-2G.

The summation of all elements in a row in the OBCT matrix is equal to 1, i.e.

$$\sum_{l=1}^{N} T_{kl} = 1.$$

Therefore, the correction coefficients in the OBCT matrix for each band are also normalized.

To avoid overflow results for the matrix production between the OBCT matrix and the spectral image vector, a data type of double precision is recommended.

The method is based on the fact that other spectral channels measure some of the light that contributes to OOB response in a particular channel. This crosstalk between multispectral radiometers provides a possibility for decomposition. Using the filter transmittance functions for all multiband sensors, an OBCT matrix for recovering in-band spectral radiance has been derived. The processing, of the OOB correction can be performed by a product between the OBCT matrix and a multispectral image vector.

The OBCT matrix for the Visible Infrared. Imager Radiometer Suite ("VIIRS"), which was successfully launched on Oct. 28, 2011, is numerically computed and demonstrated. The VIIRS multispectral sensor is used as an example of the application of the method. Clearly, it can be applied, to other multispectral sensors as well. In an embodiment of the instant invention, the OBCT reduces the relative OOB errors in the uncorrected images by a factor of up to seventeen. An embodiment of the invention can be applied to all multispectral remote sensing instruments for OOB correction.

Optionally, VIIRS filter functions are obtained from measurements of pre-launch laboratory platforms, high altitude aircraft platforms, and/or satellite platforms.

An embodiment of the invention comprises a computer program for image processing, which computer program embodies the functions, filters, or subsystems described herein. However, it should be apparent that there could he many different ways of implementing the invention in computer programming, and the invention should not be construed as limited to any one set of computer program instructions. Further, a skilled programmer would be able to write such a computer program to implement an exemplary embodiment based on the appended diagrams and associated description in the application text. Therefore, disclosure of a particular set of program code instructions is not considered necessary for an adequate understanding of how to make and use the invention. The inventive functionality of the claimed computer program will be explained in more detail in the following description read in conjunction with the figures illustrating the program flow.

One of ordinary skill in the art will recognize that the methods, systems, and control laws discussed above with respect to image processing may be implemented in software as software modules or instructions, in hardware (e.g., a standard field-programmable gate array ("FPGA") or a standard application-specific integrated circuit ("ASIC"), or in a combination of software and hardware. The methods, systems, and control laws described herein may be implemented on many different types of processing devices by program code comprising program instructions that are executable by one or more processors. The software program instructions may include source code, object code, machine code, or any other stored data that is operable to cause a processing system to perform methods described herein.

The methods, systems, and control laws may be provided on many different types of computer-readable media including computer storage mechanisms (e.g., CD-ROM, diskette, RAM, flash memory, computer's hard drive, etc.) that contain instructions fur use in execution by a processor to perform the methods operations and implement the systems described herein.

The computer components, software modules, functions and/or data structures described, herein may be connected directly or indirectly to each other in order to allow the flow of data needed for their operations, it is also ˉtoted that software instructions or a module can be implemented for example as a subroutine unit or code, or as a software function unit of code, or as an object (as in an object-oriented paradigm), or as an applet, or in a computer script language, or as another type of computer code or firmware. The software components and/or functionality may be located on a single device or distributed across multiple devices depending upon the situation at hand.

Systems and methods disclosed herein may use data signals conveyed using networks (e.g., local area network, wide area network, internet, etc.), fiber optic medium, carrier waves, wireless networks, etc. for communication with one or more data processing devices. The data signals can carry any or all of the data disclosed herein that is provided to or from a device.

This written description sets forth the best mode of the invention and provides examples to describe the invention and to enable a person of ordinary skill in the art to make and use the in union. This written description does not limit the in union to the precise terms set forth. Thus, while the invention has been described in detail with reference to the examples set forth above, those of ordinary skill in the art may effect alterations, modifications and variations to the examples without departing from the scope of the invention.

These and other implementations are within the scope of the following claims.

What is claimed as new and desired to be protected by Letters Patent of the United States is:

1. A method comprising:
measuring a band-averaged spectral radiance with an N-channel multispectral sensor using at least one optical filter, upon scanning, a plurality of original radiances, the measured total band-averaged spectral radiance, $\hat{s}_k = \hat{s}_k(i,j) = \int_{\lambda \in \{\Delta\lambda_l\}} h_k(\lambda)s(\lambda)d\lambda + \int_{\lambda \notin \{\Delta\lambda_l\}} h_k(\lambda)s(\lambda)d\lambda$, where i and j are pixel indexes, comprising a measured in-band-averaged spectral radiance and a measured band-gap-averaged spectral radiance, the measured total band-averaged spectral radiance comprising a plurality of k wavelength sub-ranges, the plurality of wavelength sub-ranges comprising a plurality of k in-band sub-ranges and a plurality a plurality of k band-gap sub-ranges, wherein a measured kth in-band band-averaged spectral radiance is represented as $$\int_{\lambda \in \{\Delta\lambda_l\}} h_k(\lambda)s(\lambda)d\lambda \approx \sum_{l=1}^{N} \overline{h}_{kl}^{(in)} \Delta\lambda_l \overline{s}_l,$$

where N is a number of a plurality of bands,
$\overline{h}_{kl}^{(in)}$ is an average of a plurality of filter response functions,
$\Delta\lambda_1$ is a width of partitioned in-band sub-band, and
$\overline{s}_l$ is a recovered lth recovered band-averaged spectral radiance that is an average of all measured signals within the sub-band $\Delta\lambda_1$, and free of an out-of-band effect,
wherein a measured k-th band-gap band-average spectral radiance is represented as $$\int_{\lambda \notin \{\Delta\lambda_l\}} h_k(\lambda)\hat{s}(\lambda)d\lambda \approx \sum_{l=1}^{N} b_{kl}\hat{s}_l,$$

where $$b_{kl} = \begin{cases} (\lambda_{min}^{(1)} - \lambda_{min})\overline{h}_{k,0}^{(out)} + \frac{\lambda_{min}^{(2)} - \lambda_{max}^{(1)}}{\lambda_2 - \lambda_1}(\lambda_2 \overline{h}_{k,1}^{(out)} - \overline{h\lambda}_{k,1}^{(out)}) & (l=1) \\ \frac{\lambda_{min}^{(l)} - \lambda_{max}^{(l-1)}}{\lambda_l - \lambda_{l-1}}(\overline{h\lambda}_{k,l-1}^{(out)} - \lambda_{l-1}\overline{h}_{k,l-1}^{(out)}) + \\ \frac{\lambda_{min}^{(l+1)} - \lambda_{max}^{(l)}}{\lambda_{l+1} - \lambda_l}(\lambda_{l+1}\overline{h}_{kl}^{(out)} - \overline{h\lambda}_{kl}^{(out)}) & (1 < l < N), \\ \frac{\lambda_{min}^{(N)} - \lambda_{max}^{(N-1)}}{\lambda_N - \lambda_{N-1}}(\overline{h\lambda}_{k,N-1}^{(out)} - \lambda_{N-1}\overline{h}_{k,N-1}^{(out)}) + \\ (\lambda_{max} - \lambda_{max}^{(N)})\overline{h}_{kN}^{(out)} & (l=N) \end{cases}$$

$$\overline{h\lambda}_{kl}^{(out)} = \frac{\int_{\lambda_{(max)}^{(l)}}^{\lambda_{min}^{(l+1)}} h_k(\lambda)\lambda d\lambda}{\lambda_{min}^{(l+1)} - \lambda_{max}^{(l)}},$$

and $$\overline{h}_{kl}^{(out)} = \frac{\int_{\lambda_{(max)}^{(l)}}^{\lambda_{min}^{(l+1)}} h_k(\lambda)d\lambda}{\lambda_{min}^{(l+1)} - \lambda_{max}^{(l)}};$$

generating from the measured band-average spectral radiance a measured multispectral radiance vector;
matrix-multiplying the measured multispectral radiance vector and a out-of-band correction transform matrix corresponding to the at least one optical filter to generate a band-average spectral radiances image vector representing a plurality of recovered band-averaged spectral radiance;
outputting th plurality of recovered band-averaged spectral radiances, thereby generating a plurality of recovered radiances free of out-of-band effects; and
determining a presence of a target based on the outputted plurality of recovered band-average spectral radiances.

2. The method according to claim 1, wherein each in-band sub-range of the plurality of k in-band sub-ranges comprises an in-band width and each hand-gap sub-ranges of the plurality of k in-band sub-ranges comprises an band-gap width,
wherein the at least one optical filter comprises at least one filter transmittance function,
wherein the plurality of sub-ranges comprises at least one in-band partition parameter, and
wherein the multispectral decomposition transform matrix is a function of at least one of the at least one filter transmittance function, the at least one partition parameter, and a position of the at least one optical filter.

3. The method according to claim 1, wherein the at least one optical filter comprises a number of multi-bands, the number of multi-bands being equal to a number of the plurality of sub-ranges.

4. The method according to claim 1, wherein the recovered and measured band-averaged spectral radiance image vectors are represented as $$\overline{s} = \begin{pmatrix} \overline{s}_1 \\ \overline{s}_2 \\ \vdots \\ \overline{s}_N \end{pmatrix}, \text{ and } \hat{s} = \begin{pmatrix} \hat{s}_1 \\ \hat{s}_2 \\ \vdots \\ \hat{s}_N \end{pmatrix}$$

wherein each components $\bar{s}_n$ and $\hat{s}_n$ of the recovered and measured band-averaged spectral radiance vectors are single hand images.

5. The method according to claim 1, wherein the recovered band-averaged spectral radiance image vector is represented as $\bar{s}=T\hat{s}$, wherein the out-of-baud correction transform matrix T is defined by $T=A^{-1}(I-B)$, wherein matrix $A=(\bar{h}_{kl}^{(in)}\Delta\lambda_1)$ and matrix $B=(h_{kl})$ are N×N, wherein matrix I is a N×N identity matrix, wherein $\hat{s}$ is the measured band-averaged spectral radiance image vector.

6. A method according to claim 1, wherein the band-averaged spectral radiance comprises a VIIRS band-averaged spectral radiance.

7. The method according to claim 1, wherein at least one optical filter resides on one of an aircraft and a satellite.

\* \* \* \* \*